(12) United States Patent
Dürbaum

(10) Patent No.: US 7,579,900 B2
(45) Date of Patent: Aug. 25, 2009

(54) OPERATION AND CIRCUITRY OF A POWER CONVERSION AND CONTROL CIRCUIT

(75) Inventor: Thomas Dürbaum, Baiersdorf (DE)

(73) Assignee: NXP B.V., Eindhoven (NL)

( * ) Notice: Subject to any disclaimer, the term of this patent is extended or adjusted under 35 U.S.C. 154(b) by 496 days.

(21) Appl. No.: 10/567,396

(22) PCT Filed: Aug. 9, 2004

(86) PCT No.: PCT/IB2004/051419

§ 371 (c)(1),
(2), (4) Date: Feb. 7, 2006

(87) PCT Pub. No.: WO2005/015741

PCT Pub. Date: Feb. 17, 2005

(65) Prior Publication Data

US 2008/0150609 A1    Jun. 26, 2008

(30) Foreign Application Priority Data

Aug. 12, 2003   (EP) .................................. 03102500

(51) Int. Cl.
*H01L 35/00*       (2006.01)

(52) U.S. Cl. ...................................... 327/513; 327/404
(58) Field of Classification Search ................ 327/110, 327/403, 404, 427, 512, 513
See application file for complete search history.

(56) References Cited

U.S. PATENT DOCUMENTS

| | | | | |
|---|---|---|---|---|
| 5,796,278 A | * | 8/1998 | Osborn et al. | 327/108 |
| 5,801,572 A | * | 9/1998 | Nakamura | 327/434 |
| 5,952,869 A | * | 9/1999 | Fattori et al. | 327/404 |
| 6,100,728 A | * | 8/2000 | Shreve et al. | 327/110 |
| 6,218,888 B1 | * | 4/2001 | Otsuki | 327/419 |
| 7,183,816 B2 | * | 2/2007 | Martelloni | 327/112 |

* cited by examiner

*Primary Examiner*—Jeffrey S Zweizig

(57) ABSTRACT

Since parallel MOSFETs are usually driven with one gate signal in power applications, the current sharing between the MOSFETs is automatically established with regard to the characteristics of the individual MOSFETs. This may lead to a large non-uniformity of the current distribution between the MOSFETs. According to the present invention, an individual control of the on-resistances of the MOSFETs is provided, which allows for an improved current sharing between paralleled MOSFETs.

15 Claims, 5 Drawing Sheets

OPERATION AND CIRCUITRY OF A POWER CONVERSION AND CONTROL CIRCUIT

The present invention relates to an electric circuit and to a method of operating a first MOSFET and a second MOSFET.

Power amplification, conversion and control with paralleled MOSFETs, is widely used in various power applications. In particular, such circuits find widespread use in automotive and industrial applications. Such circuits obtain high current ratings by paralleling the MOSFETs. Due to the paralleling of several MOSFETs which are driven with one gate signal, higher currents may be achieved.

However, due to the fact that the parallel MOSFETs are driven with one gate signal, the current sharing between the devices establishes automatically with regard to the characteristics of the individual devices. This may lead to a large non-uniformity of the current sharing between the MOSFETs, even despite the self-balancing effect of the MOSFETs (RDSon gets higher for the FET, with the higher losses due to heating up). The difference in current may lead to higher maximum currents for the respective MOSFETs. Therefore, the individual devices, i.e. MOSFETs, have to be overrated, resulting in bigger and more costly devices. Furthermore, the power dissipation is different, and hot spots may occur, leading to reliability problems.

It is an object of the present invention to provide for improved electronic circuit for power conversion or control.

According to an aspect of the present invention, the above object may be solved by an electronic circuit comprising a first and a second MOSFET. The first and the second MOSFETs are arranged parallel to each other. The first MOSFET has a first resistance when it is switched on, and the second MOSFET has a second resistance when it is switched on. According to an aspect of the present invention, there is provided a MOSFET resistance control for individually controlling at least one of the first resistance of the first MOSFET and the second resistance of the second MOSFET.

Due to the individual control of the first and second resistances of the first and second MOSFETs, an improved current sharing may be achieved between these parallel MOSFETs. Advantageously, this may allow for the use of smaller devices, i.e. smaller rated MOSFETs and an over-dimensioning is reduced. Also, due to the more equal distribution of the currents flowing through the MOSFETs, a better heat distribution may be achieved. This may allow to avoid hot spots. Overall, this exemplary embodiment of the present invention may allow for an increased reliability of the electronic circuit.

According to another exemplary embodiment of the present invention as set forth in claim 2, the MOSFET resistance control circuit comprises a gate voltage control circuit for individually controlling at least one of the first and second gate voltages of the first and second MOSFETs, to thereby control at least one of the first and second resistances of the MOSFETs. Advantageously, this allows for a very simple control of the MOSFET resistances. Thus, a very simple circuit may be provided at low cost, which has a minimal component count and a high reliability.

According to another exemplary embodiment of the present invention as set forth in claim 3, the gate voltage control circuit controls the first and second voltages, such that the resistances are adjusted to each other. The adjustment of the resistances of the MOSFETs allows for the currents flowing through the MOSFETs to be equalized. Thus, a temperature difference between the MOSFETs may be reduced or avoided.

According to another exemplary embodiment of the present invention as set forth in claim 4, there is further provided a current measuring unit for measuring at least one of a first current through the first MOSFET and a second current flowing through the second MOSFET. Furthermore, according to this exemplary embodiment of the present invention, the gate voltage control circuit is adapted to individually control at least one of the first and second voltages on the basis of the first and second currents. This may allow for a very accurate control of the currents flowing through the MOSFETs and the resistances of the MOSFETs. Also a direct feedback control may be realized.

According to another exemplary embodiment of the present invention as set forth in claim 5, a temperature sensor for measuring at least one of a first temperature of the first MOSFET and a second temperature of the second MOSFET is provided. The gate voltage control is adapted to control the first and second voltages on the basis of at least one of the first and second temperatures. Thus, due to the temperature based control of the first and second voltages of the MOSFETs, an over-heating of the MOSFETs may be avoided and thus the reliability of the circuitry may be increased.

According to another exemplary embodiment of the present invention as set forth in claim 6, the gate voltage control circuit only performs a control of the first and second voltages when one of the first and second temperatures exceeds a first pre-set temperature. Thus, the electronic circuit may be operated in a way that as long as there is no temperature exceeding the threshold temperature, no adaptation or control of the gate voltages of the MOSFET is performed. The control of the gate voltage is only performed when a temperature exceeding the pre-set threshold temperature is detected.

According to another exemplary embodiment of the present invention as set forth in claim 7, the temperatures of at least two MOSFETs are measured and the gate voltage control circuit is adapted to perform a control of the first and second voltages only, when a difference of these temperatures exceeds a second pre-set temperature. Thus, the MOSFET resistances are adjusted to each other and excess temperature differences between the MOSFETs may be avoided.

According to other exemplary embodiments of the present invention as set forth in claims 8 and 9, the resistances of the MOSFETs which are controlled, are the RDSon. Furthermore, the MOSFETs and the electronic circuits may be a power module, in particular for use in automotive or industrial applications. A power module may comprise at least two paralleled MOSFETs.

According to another exemplary embodiment of the present invention as set forth in claim 10, a method is provided of operating a first MOSFET and a second MOSFET, which are arranged parallel to each other, wherein the resistances of the MOSFETs are controlled individually. Advantageously, a very simple control method is provided, which allows to improve a current sharing between parallel MOSFETs and thus the provision of smaller and less costly devices, due to the fact that an over dimensioning may be avoided. Furthermore, this method may provide for a better heat distribution and the avoidance of hot spots, which may cause increased reliability of the MOSFETs.

Claims 11 to 15 provide for further exemplary embodiments of the method according to the present invention.

It may be seen as the gist of an exemplary embodiment of the present invention that the resistances, i.e. RDSon of the MOSFETs are controlled individually. Thus, in a circuit comprising a plurality of MOSFETs, a better MOSFET, which has a smaller RDSon than the other MOSFETs and is thus charged with a higher current, is artificially made worse, such that the resistances of the MOSFETs are adjusted to each other or equalized. By this, the current sharing of the MOSFETs may be improved, which may allow to improve a heat distribution between the MOSFETs, which allows for a higher reliability and a reduced over-dimensioning of the MOSFETs.

These and other aspects of the present invention will become apparent from and elucidated with reference to the embodiments described hereinafter.

Exemplary embodiments of the present invention will be described in the following with reference to the following drawings.

Figure 1:
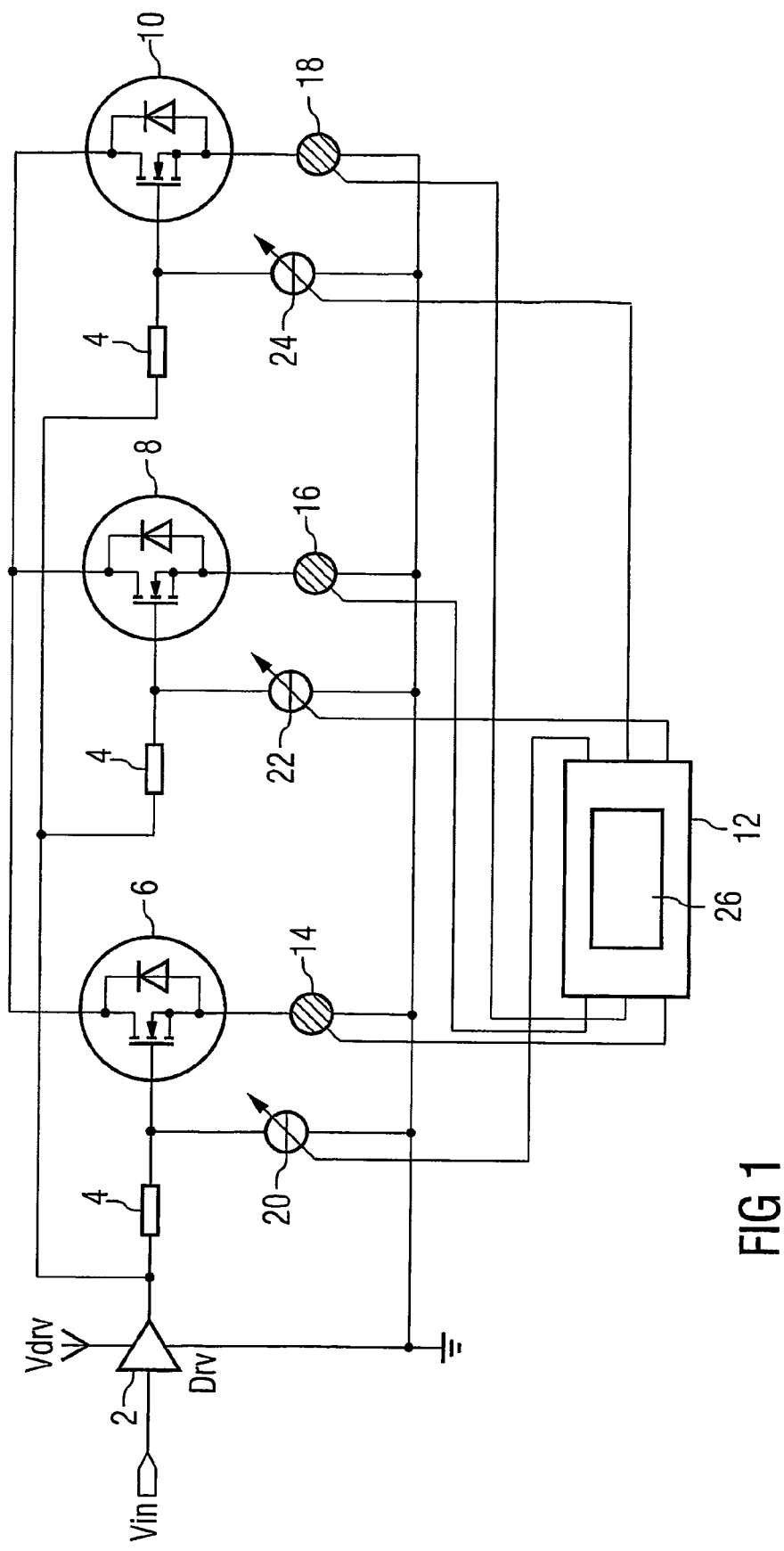
FIG. 1 shows a simplified circuit diagram of a first exemplary embodiment of the present invention.

FIG. 1 shows a simplified circuit diagram of a first exemplary embodiment of an electronic circuit according to the present invention. This electronic circuit may be a power module, including a plurality of MOSFETs. The electronic circuit depicted in FIG. 1 may be implemented as one constructional unit or one package. Such electronic power modules find widespread use, in particular in automotive and industrial applications.

As may be taken from FIG. 1, there is provided a driver 2 and gate resistors 4 for driving the plurality of MOSFETs, here the first MOSFET 6, the second MOSFET 8 and the third MOSFET 10. It has to be noted that the circuitry depicted in FIG. 1 does not show the actual circuit arrangement and connections of the MOSFETs 6 to 8, but the abstract arrangement thereof.

Furthermore, there are provided first, second and third current measurement units 14, 16 and 18, which are respectively measuring the first, second and third currents flowing through the first, second and third MOSFETs 6, 8 and 10. The first, second and third current measuring units 14, 16 and 18 are connected to a MOSFET resistance control circuit 12, which is adapted to individually control at least one of the resistances RDSon of the first, second and third MOSFETs 6, 8 and 10. The MOSFET resistance control circuit 12 comprises a gate voltage control circuit 26 to individually control at least one of the gate to source voltages of the first, second and third MOSFETs 6, 8 and 10 to thereby control at least one of the resistances RDSon of the first, second and third MOSFETs 6, 8 and 10.

Furthermore, there are provided controlled current sources 20, 22 and 24 for controlling the gate to source voltages of the first, second and third MOSFETs 6, 8 and 10. As may be taken from FIG. 1, the controlled current sources 20, 22 and 24 are controlled by means of the MOSFET resistance control circuit 12.

There are many known implementations of the current measuring units 14, 16 and 18. According to an exemplary embodiment of the present invention, these current measuring units 14, 16 and 18 may, for example, be implemented by resistors, current transformers, sense-FETs, Hall sensors or other suitable current measuring devices.

Also, instead of the current sources 20, 22 and 24, it is possible to provide, for example, controllable resistors.

Figure 2:
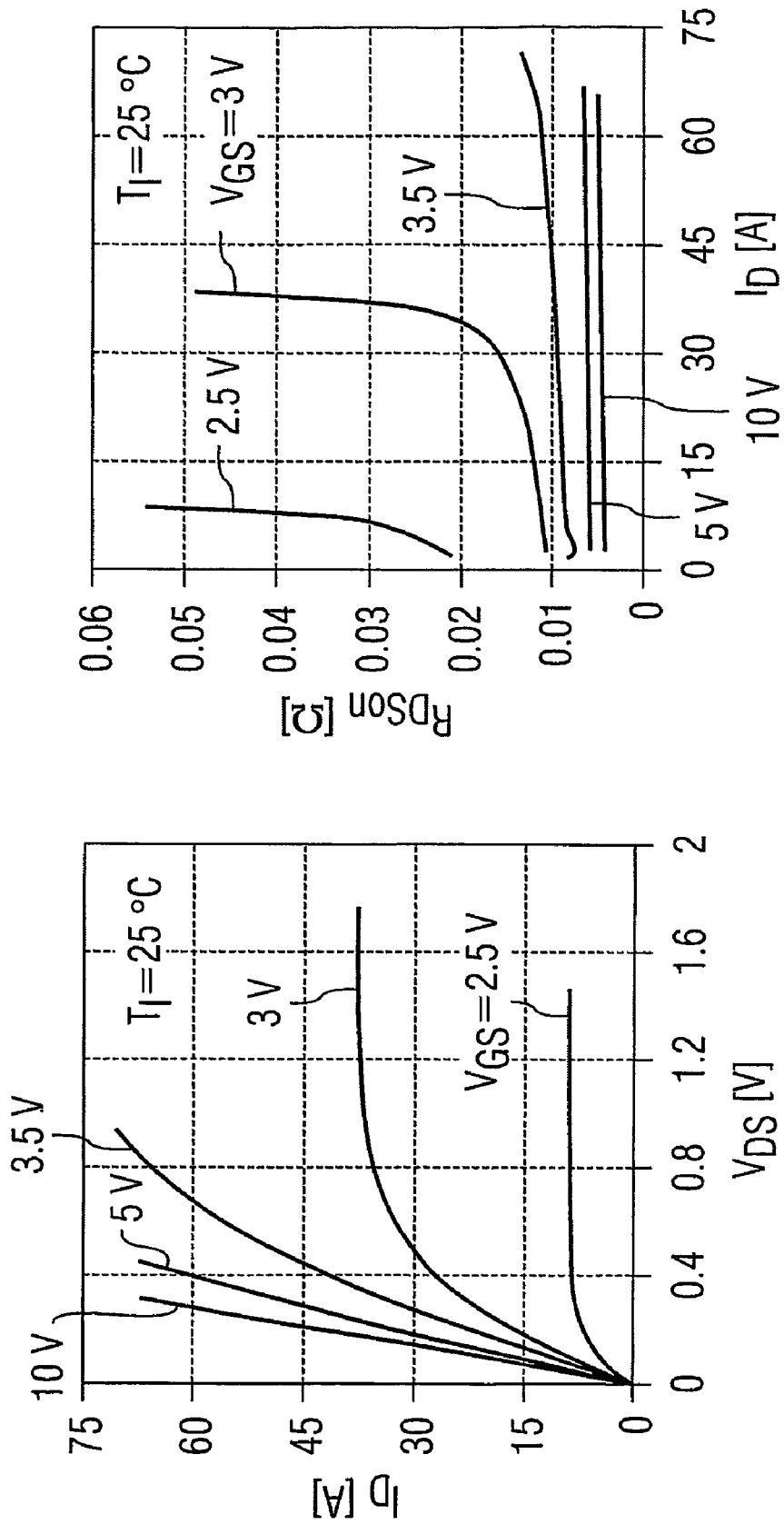
FIG. 2 shows two charts depicting MOSFET characteristics of an exemplary MOSFET as it may be used according to the present invention, showing the RDSon dependency on the gate to source voltage.

FIG. 2 shows characteristics of exemplary MOSFETs showing the RDSon dependency on the gate to source voltage of the respective MOSFETs.

According to an aspect of the present invention, it has been found that the RDSon dependency on the gate to source voltage of the respective MOSFETs, as depicted in FIG. 2, may be used for the control of the MOSFETs in power modules. In particular, it was found that by the respective adjustment of the gate to source voltage of the respective MOSFETs, a substantially equal current sharing between MOSFETs arranged in parallel, as depicted in FIG. 1, may be realized. Also, according to an aspect of the present invention, equal losses or an equal temperature, as described in more detail with respect to FIG. 4, may be realized. Also, by the control of the gate to source voltage, a temperature difference between MOSFETs of a power module may be controlled. Advantageously, smaller devices may be realized, hot spots may be avoided and a higher reliability of the electronic circuit may be realized.

Figure 3:
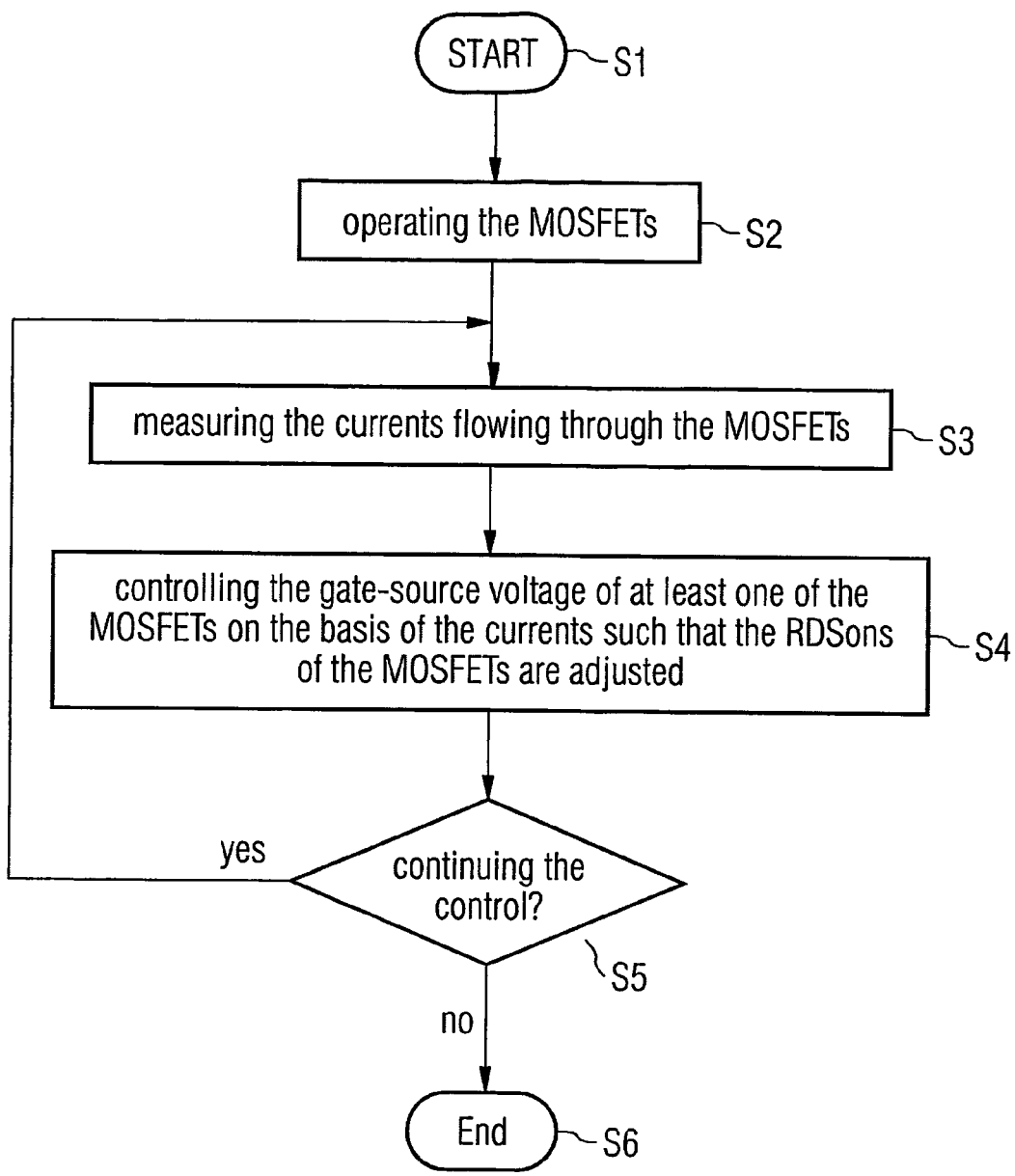
FIG. 3 shows a simplified flow-chart of a method of operating the electronic circuit depicted in FIG. 1, according to an exemplary embodiment of the present invention.

FIG. 3 shows a simplified flow-chart of a first exemplary embodiment of operating the electronic circuit depicted in FIG. 1 according to the present invention.

After the start in step S1, the method continues to step S2, where the MOSFETs are operated. Then, the method continues to step S3, where the currents flowing through the MOSFETs 6, 8 and 10 are measured by means of the current measurement units 14, 16 and 18. According to an aspect of the present invention, it may be sufficient to measure only one current flowing through one of the MOSFETs and to then control the gate to source voltage of this respective MOSFET. However, according to another aspect of the present invention, a plurality of currents flowing through the MOSFETs may be measured and used for the subsequent control of the respective gate to source voltages. Then, the method continues to step S4, where the gate to source voltage of at least one of the MOSFETs 6, 8 and 10 is controlled on the basis of the currents measured in step S3, such that the RDSons of the MOSFETs are adjusted. Preferably, according to an aspect of the present invention, the RDSons are adjusted, such that they become equal for all of the MOSFETs 6, 8 or 10.

As mentioned above, the control of the RDSons may be implemented by means of the gate voltage control circuit 26, controlling the gate to source voltages of the MOSFETs 6, 8 and 10, respectively controlling the current sources 20, 22 and 24. Advantageously, due to the operation described with respect to FIG. 3, an improved current sharing between the paralleled MOSFETs 6, 8 and 10 may be achieved. Due to this, smaller MOSFETs and thus smaller devices may be realized, since less over-dimensioning of the MOSFETs has to be taken into account. Also, a better heat distribution may be achieved, due to the more equal current distribution among the MOSFETs.

Advantageously, due to this, hot spots in the module may be avoided, which also gives rise to an increased reliability of the electronic circuit.

Figure 4:
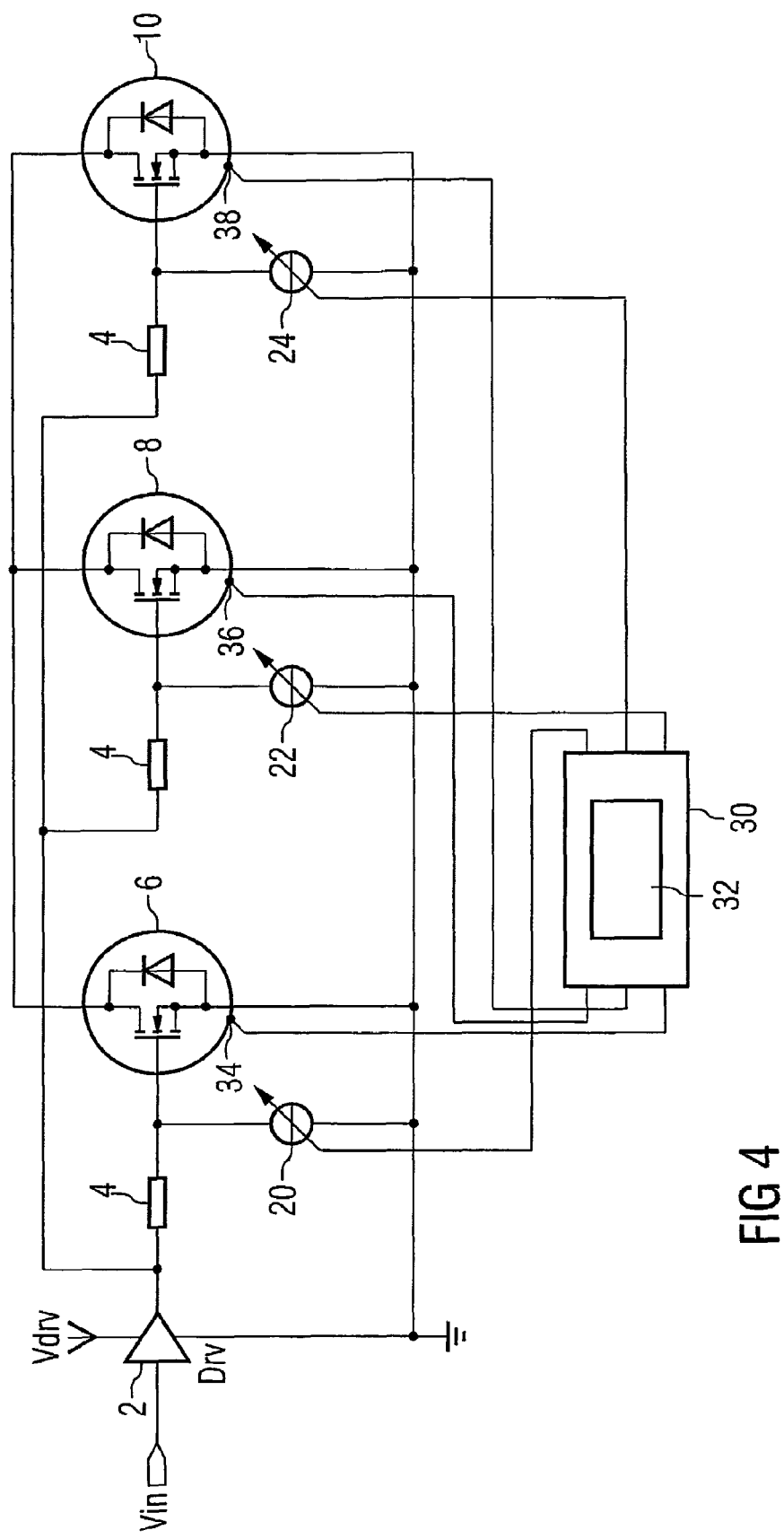
FIG. 4 shows a simplified circuit diagram of a second exemplary embodiment of an electronic circuit according to the present invention.

FIG. 4 shows a simplified circuit diagram of a second exemplary embodiment of the electronic circuit according to the present invention. Preferably, as the electronic circuit of FIG. 1, this electronic circuit according to the second exemplary embodiment of the present invention is also a power module, in particular for the application in automotive or industrial applications.

In FIG. 4, the same reference numerals are used to designate the same or corresponding elements as in FIG. 1.

As may be taken from FIG. 4, there are provided the controlled current sources 20, 22 and 24 for effecting the control of the gate to source voltages of the first, second and third MOSFETs 6, 8 and 10, which are arranged parallel to each other. Furthermore, there is provided a MOSFET resistance control circuit 30, comprising a gate voltage control circuit 32 for individually controlling at least one of the controlled current sources 20, 22 and 24 to effect a control of the respective gate to source voltage of the respective MOSFETs to thereby control the respective resistances RDSon of the first, second and third MOSFETs 6, 8 and 10.

Furthermore, there are provided temperature sensors 34, 36 and 38, which are respectively connected to the MOSFET resistance control circuit 30. As may be taken from FIG. 4, the temperature sensor 34 is associated with the first MOSFET 6, the temperature sensor 36 is associated with the second MOSFET 8 and the temperature sensor 38 is associated with the third MOSFET 10. The respectively associated temperature sensors 34, 36 and 38 are respectively arranged such that they measure the temperatures of the respective MOSFETs 6, 8 or 10. Preferably, the temperature sensors 34, 36 and 38 are arranged close to the respective MOSFETs 6, 8 or 10. Preferably, they are arranged on the package or near the die or even on the same die.

According to exemplary embodiments of the temperature sensors 34, 36 and 38, these temperature sensors may be realized by means of temperature sensitive resistors, temperature sensing diodes or other suitable known temperature sensors.

The gate voltage control circuit 32 is adapted to individually control at least one of the gate to source voltages of the MOSFETs 6, 8 and 10 on the basis of the temperatures measured by the temperature sensors 34, 36 and 38.

The gate voltage control circuit 32 is adapted to individually control at least one of the gate to source voltages of the MOSFETs 6, 8 and 10 on the basis of at least one of the temperatures measured by the temperature sensors 34, 36 and 38.

According to an aspect of the present invention, the gate voltage control circuit 32 is adapted such that it controls the gate to source voltage of a particular MOSFET of the MOSFETs 6, 8 and 10 on the basis of the temperature measured at this particular MOSFET 6, 8 and 10 by one of the temperature sensors 34, 36 and 38. Also, the gate voltage control circuit 32 may be adapted such that it controls the gate to source voltage of the MOSFETs 6, 8 and 10 on the basis of the temperatures of the MOSFETs 6, 8 and 10.

According to an aspect of this exemplary embodiment of the present invention, the gate voltage control circuit 32 is adapted such that it controls at least one of the gate to source voltages of the MOSFETs 6, 8 and 10 only when one of the measured temperatures exceeds a pre-set threshold temperature. Depending on the technology of the MOSFETs, this threshold temperature may be in the range of 105° C. up to 110° C. However, depending on the respective technology, threshold values in the range starting from 90° C. up to almost 200° C. may be selected.

According to another aspect of the present invention, the gate voltage control circuit 32 is adapted such that it detects a temperature difference between at least two MOSFETs of the first, second and third MOSFETs 6, 8 and 10. Then, according to this aspect of this exemplary embodiment of the present invention, the gate voltage control circuit controls at least one of the gate to source voltages of the at least two MOSFETs on the basis of the detected temperature difference. In particular, such control may be implemented such that the gate to source voltage control is only implemented when such temperature difference exceeds a pre-set value, such as, for example, if the temperature difference exceeds 5° C. However, this temperature difference threshold is dependent on the technology of the MOSFET.

Naturally, according to a further aspect of the present invention, the above two aspects may be combined.

Figure 5:
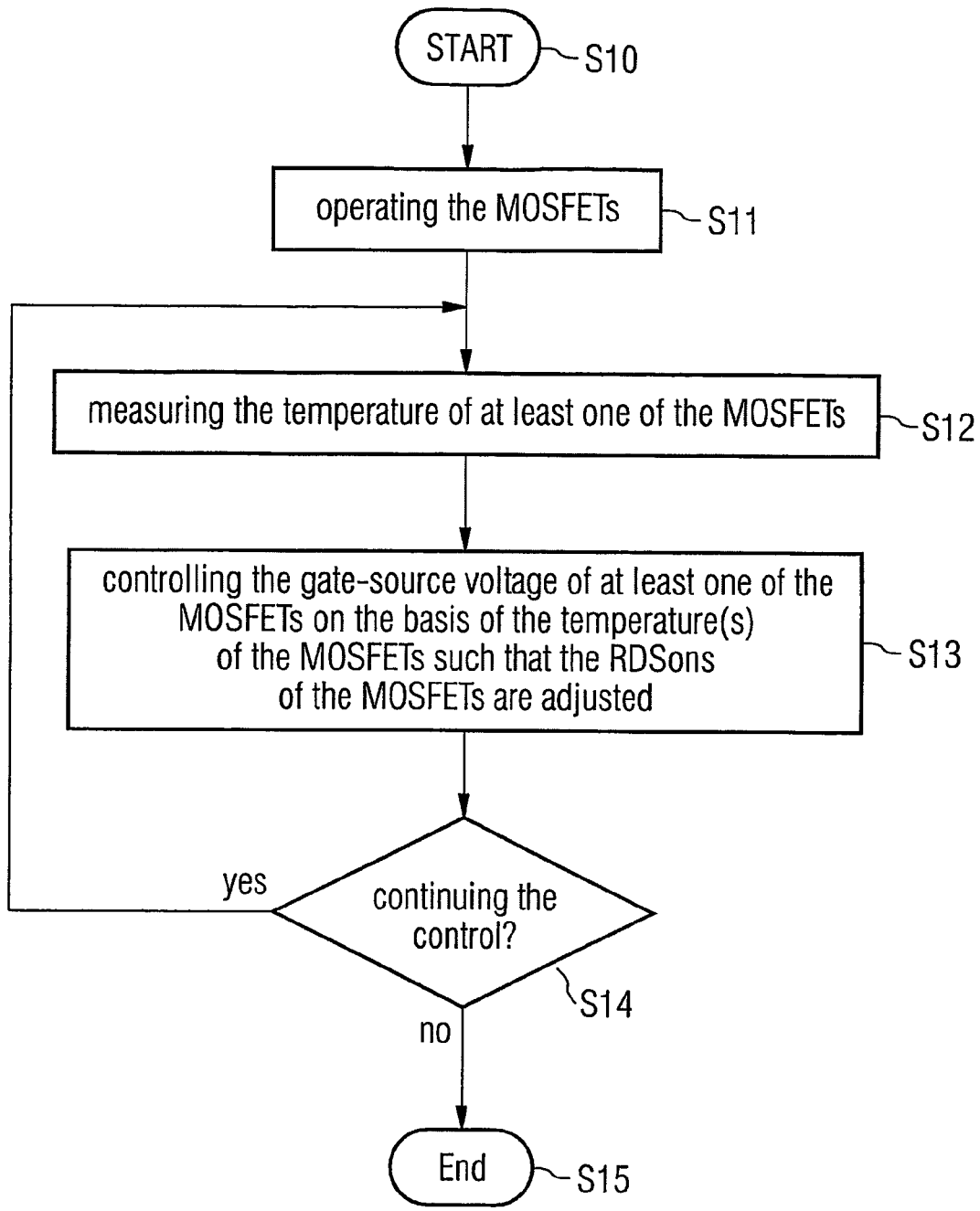
FIG. 5 shows a simplified flow-chart of an exemplary embodiment of a method of operating the electronic circuit of FIG. 4 according to the present invention.

FIG. 5 shows a simplified flow-chart of an exemplary embodiment of a method of operating the electronic circuit of FIG. 4.

As may be taken from FIG. 5, after the start in step S10, the method continues to step S11, where the MOSFETs are operated. Then, in the subsequent step S12, the temperature of at least one of the MOSFETs is measured. Then, in the subsequent step S13, at least one of the gate to source voltages of at least one of the MOSFETs is controlled on the basis of the temperature(s) of the MOSFETs, such that the RDSons of the MOSFETs are adjusted. As mentioned above, such control may be implemented on the basis of an absolute temperature, i.e. in case the temperature of one of the MOSFETs exceeds a threshold value or on the basis of a temperature difference occurring between at least two of the MOSFETs.

Then, in step S14, it is determined whether the control is to be continued. In case it is determined that the control is to be continued, the method returns to step S12. In case it is determined in step S14 that the control is not to be continued, the method continues to step S15, where it ends.

According to another exemplary embodiment of the present invention, the current based gate to source voltage control depicted in FIGS. 1 and 3 may be combined with the temperature based gate to source voltage control depicted in FIGS. 4 and 5. Thus, by implementing a gate to source voltage control on the basis of the current flowing through the MOSFETs and the temperatures of the MOSFETs, a very accurate control may be achieved.

According to an aspect of the present invention, an improved current sharing between paralleled MOSFETs may be achieved. Furthermore, due to the improved current sharing, smaller devices may be implemented and less over-dimensioning of the respective components is necessary. Furthermore, the present invention may allow for a better heat distribution and the avoidance of hot spots, which leads to an improved reliability of the overall electronic circuit.

According to a further aspect of the present invention, instead of having only one gate driver 2, separate gate drivers may be provided for each of the MOSFETs 6, 8 and 10. According to this aspect, the current sources 20, 22 and 24 may be provided to individually control the resistances of the MOSFETs 6, 8 and 10, the currents through the MOSFETs or the temperatures of the MOSFETs 6, 8 and 10. Also, instead of providing the output signals of the resistance control circuits 12 and 30 to the current sources 20, 22 and 24, these output signals may be provided to the individual drivers of the MOSFETs 6, 8 and 10, to thereby individually control the respective driving voltages. Then, no controlled current sources need to be provided.

According to another aspect of the present invention, instead of the provision of the current sources 20, 22 and 24 in the embodiments of FIGS. 1 and 4, it is also possible to provide respective resistors. Then, by further providing a variable resistor in series to each of the resistors 4, which is controlled by the output signals of the resistance control circuits 12 and 30, the driving voltages of the MOSFETs 6, 8 and 10 may be individually controlled. Thus, by controlling these variable resistors arranged in series to the resistors 4, a very simple adjustment of the gate voltage of the respective MOSFETs 6, 8 and 10 may be provided. Advantageously, this may allow for reduced losses in the gate circuitry.

Furthermore, according to another aspect of the present invention, the resistance control circuits 12 and 30 may be realized as digital control blocks, for example, by means of state machines or EPLDs or may be arranged as analog control blocks.

The invention claimed is:

1. Electronic circuit, comprising: a first MOSFET and a second MOSFET; wherein the first MOSFET and the second MOSFET are arranged parallel to each other; wherein the first MOSFET has a first resistance when it is switched on and the second MOSFET has a second resistance when it is switched on; a temperature sensor for measuring at least one of a first temperature of the first MOSFET and a second temperature of the second MOSFET; and a MOSFET resistance control circuit for individually controlling at least one of the first resistance of the first MOSFET and the second resistance of the second MOSFET based at least partly on measured temperature provided from the temperature sensor.

2. The electronic circuit of claim 1, wherein the MOSFET resistance control circuit comprises a gate voltage control circuit for individually controlling at least one of a first gate voltage of the first MOSFET and a second gate voltage of the second MOSFET to control at least one of the first resistance of the first MOSFET and the second resistance of the second MOSFET.

3. The electronic circuit of claim 2, wherein the gate voltage control circuit controls the at least one of the first and second voltages such that at least one of the first and second resistances, first and second currents flowing through the first and second MOSFETs and first and second temperatures of the first and second MOSFETs are adjusted to each other.

4. The electronic circuit of claim 2, further comprising a current measuring unit for measuring at least one of a first current flowing through the first MOSFET and a second current flowing through the second MOSFET; wherein the gate voltage control circuit is adapted to individually control the at least one of the first and second voltages on the basis of at least one of the first and second currents.

5. The electronic circuit of claim 1, wherein the first resistance of the first MOSFET is the RDSon of the first MOSFET and the second resistance of the second MOSFET is the RDSon of the second MOSFET.

6. The electronic circuit of claim 1, wherein the electronic circuit is a power module in particular for the use in automotive applications.

7. Electronic circuit, comprising: a first MOSFET and a second MOSFET; wherein the first MOSFET and the second MOSFET are arranged parallel to each other; wherein the first MOSFET has a first resistance when it is switched on and the second MOSFET has a second resistance when it is switched on; and a MOSFET resistance control circuit for individually controlling at least one of the first resistance of the first MOSFET and the second resistance of the second MOSFET;
wherein the MOSFET resistance control circuit comprises a gate voltage control circuit for individually controlling at least one of a first gate voltage of the first MOSFET and a second gate voltage of the second MOSFET to control at least one of the first resistance of the first MOSFET and the second resistance of the second MOSFET; and
a temperature sensor for measuring at least one of a first temperature of the first MOSFET and a second temperature of the second MOSFET; wherein the gate voltage control circuit is adapted to individually control the at least one of a first and second voltages on the basis of the at least one of the first and second temperatures.

8. The electronic circuit of claim 7, wherein the gate voltage control circuit controls the at least one of a first and second voltages only when one of the first and second temperatures exceeds a first preset threshold value.

9. The electronic circuit of claim 7, wherein the temperature sensor is adapted for measuring the first temperature and the second temperature; and wherein the gate voltage control circuit controls the at least one of a first and second voltages only when a difference of the first and second temperatures exceeds a preset value.

10. Method of operating a first MOSFET and a second MOSFET, wherein the first MOSFET and the second MOSFET are arranged parallel to each other, wherein the first MOSFET has a first resistance when it is switched on and the second MOSFET has a second resistance when it is switched on, the method comprising the step of: individually controlling at least one of the first resistance of the first MOSFET and the second resistance of the second MOSFET based on a temperature measurement of at least one of the first and second MOSFETs.

11. The method of claim 10, further comprising the step of: individually controlling at least one of a first gate voltage of the first MOSFET and a second gate voltage of the second MOSFET to thereby control at least one of the first resistance of the first MOSFET and the second resistance of the second MOSFET such that the first and second resistances are adjusted to each other.

12. The method of claim 11, further comprising the steps of: measuring at least one of a first current flowing through the first MOSFET and a second current flowing through the second MOSFET individually controlling the at least one of the first and second voltages on the basis of at least one of the first and second currents and the at least one temperature measurement.

13. The method of claim 11, further comprising the steps of: measuring at least one of a first temperature of the first MOSFET and a second temperature of the second MOSFET; individually controlling the at least one of a first and second voltages on the basis of the at least one of the first and second temperatures.

14. The method of claim 13, further comprising the step of: controlling the at least one of a first and second voltages only when one of the first and second temperatures exceeds a first preset threshold value.

15. The method of claim 13, further comprising the steps of: measuring the first temperature and the second temperature; and individually controlling the at least one of a first and second voltages only when a difference of the first and second voltages exceeds a preset value.

* * * * *